US009224918B2

(12) United States Patent
Smirnov et al.

(10) Patent No.: US 9,224,918 B2
(45) Date of Patent: Dec. 29, 2015

(54) LIGHT EMITTING DIODE WITH NANOSTRUCTURED LAYER AND METHODS OF MAKING AND USING

(71) Applicant: WOSTEC, INC., San Francisco, CA (US)

(72) Inventors: Valery K. Smirnov, Yaroslavl (RU); Dmitry S. Kibalov, Yaroslavl (RU)

(73) Assignee: Wostec, Inc. 032138/0242, San Francisco, CA (US)

( * ) Notice: Subject to any disclaimer, the term of this patent is extended or adjusted under 35 U.S.C. 154(b) by 0 days.

(21) Appl. No.: 14/172,505

(22) Filed: Feb. 4, 2014

(65) Prior Publication Data

US 2014/0151715 A1    Jun. 5, 2014

Related U.S. Application Data

(63) Continuation of application No. PCT/RU2011/000594, filed on Aug. 5, 2011.

(51) Int. Cl.
| | |
|---|---|
| *H01L 33/22* | (2010.01) |
| *H01L 33/20* | (2010.01) |
| *B82Y 20/00* | (2011.01) |
| *H01L 33/00* | (2010.01) |
| *H01L 33/32* | (2010.01) |
| *B82Y 40/00* | (2011.01) |
| *B82Y 30/00* | (2011.01) |

(52) U.S. Cl.
CPC .............. *H01L 33/22* (2013.01); *B82Y 20/00* (2013.01); *H01L 33/007* (2013.01); *H01L 33/20* (2013.01); *H01L 33/32* (2013.01); *B82Y 30/00* (2013.01); *B82Y 40/00* (2013.01); *H01L 2933/0083* (2013.01)

(58) Field of Classification Search
CPC .................................. H01L 33/22; H01L 33/20
See application file for complete search history.

(56) References Cited

U.S. PATENT DOCUMENTS

| | | |
|---|---|---|
| 4,009,933 A | 3/1977 | Firester |
| 4,072,541 A | 2/1978 | Meulenberg et al. |
| 4,233,109 A | 11/1980 | Nishizawa |
| 4,400,409 A | 8/1983 | Izu et al. |

(Continued)

FOREIGN PATENT DOCUMENTS

| | | | |
|---|---|---|---|
| CN | 101486442 A | * | 7/2009 |
| RU | 2141699 C1 | | 11/1999 |

(Continued)

OTHER PUBLICATIONS

Keller et al., "Optical and structural properties of GaN nanopillar and nanostripe arrays with embedded InGaN/GaN multi-quantum wells", Journal of Applied Physics, 100 (2006): pp. 054314-1 to 054314-7.*

(Continued)

*Primary Examiner* — Michele Fan
(74) *Attorney, Agent, or Firm* — Lowe Graham Jones PLLC; Bruce E. Black

(57) ABSTRACT

A light emitting diode has a plurality of layers including at least two semiconductor layers. A first layer of the plurality of layers has a nanostructured surface which includes a quasi-periodic, anisotropic array of elongated ridge elements having a wave-ordered structure pattern, each ridge element having a wavelike cross-section and oriented substantially in a first direction.

16 Claims, 12 Drawing Sheets

(56) References Cited

U.S. PATENT DOCUMENTS

| | | | |
|---|---|---|---|
| 4,857,080 A | | 8/1989 | Baker et al. |
| 5,160,618 A | | 11/1992 | Burggraaf et al. |
| 5,473,138 A | * | 12/1995 | Singh et al. ............ 219/121.69 |
| 5,498,278 A | | 3/1996 | Edlund |
| 5,530,272 A | | 6/1996 | Kudo et al. |
| 5,578,379 A | * | 11/1996 | Stutzmann et al. ............ 428/446 |
| 5,652,020 A | | 7/1997 | Collins et al. |
| 5,702,503 A | | 12/1997 | Tse Tang |
| 5,734,092 A | | 3/1998 | Wang et al. |
| 5,747,180 A | * | 5/1998 | Miller et al. .................. 428/601 |
| 5,753,014 A | | 5/1998 | Van Rijn |
| 6,258,617 B1 | * | 7/2001 | Nitta et al. ....................... 438/46 |
| 6,274,007 B1 | * | 8/2001 | Smirnov et al. .......... 204/192.13 |
| 6,417,939 B1 | | 7/2002 | Laude |
| 6,452,724 B1 | | 9/2002 | Hansen et al. |
| 6,518,194 B2 | | 2/2003 | Winningham et al. |
| 6,580,172 B2 | | 6/2003 | Mancini et al. |
| 6,667,240 B2 | | 12/2003 | Ozaki et al. |
| 6,706,576 B1 | | 3/2004 | Ngo et al. |
| 6,810,899 B2 | | 11/2004 | Franz et al. |
| 6,954,275 B2 | | 10/2005 | Choi et al. |
| 7,001,446 B2 | | 2/2006 | Roark et al. |
| 7,175,694 B2 | | 2/2007 | Ma et al. |
| 7,265,374 B2 | | 9/2007 | Lee et al. |
| 7,338,275 B2 | | 3/2008 | Choi et al. |
| 7,384,792 B1 | | 6/2008 | Wang et al. |
| 7,453,565 B2 | | 11/2008 | Wang et al. |
| 7,604,690 B2 | | 10/2009 | Smirnov et al. |
| 7,768,018 B2 | | 8/2010 | Smirnov et al. |
| 7,791,190 B2 | | 9/2010 | Flores et al. |
| 7,977,252 B2 | | 7/2011 | Smirnov et al. |
| 8,033,706 B1 | * | 10/2011 | Kelly et al. ................... 362/607 |
| 8,426,320 B2 | | 4/2013 | Smirnov et al. |
| 8,859,440 B2 | | 10/2014 | Smirnov et al. |
| 8,859,888 B2 | * | 10/2014 | Smirnov et al. ............... 136/256 |
| 2002/0074307 A1 | * | 6/2002 | Cotteverte et al. ................ 216/2 |
| 2002/0142704 A1 | | 10/2002 | Hu et al. |
| 2002/0154403 A1 | | 10/2002 | Trotter |
| 2003/0152787 A1 | | 8/2003 | Arakawa et al. |
| 2003/0171076 A1 | | 9/2003 | Moloney et al. |
| 2003/0183270 A1 | | 10/2003 | Falk et al. |
| 2003/0218744 A1 | | 11/2003 | Shalaev et al. |
| 2004/0070829 A1 | | 4/2004 | Kurtz et al. |
| 2004/0129135 A1 | | 7/2004 | Roark et al. |
| 2004/0174596 A1 | | 9/2004 | Umeki |
| 2004/0190116 A1 | * | 9/2004 | Lezec et al. ................... 359/298 |
| 2004/0201890 A1 | | 10/2004 | Crosby |
| 2004/0238851 A1 | | 12/2004 | Flores et al. |
| 2005/0046943 A1 | | 3/2005 | Suganuma |
| 2006/0043400 A1 | | 3/2006 | Erchak et al. |
| 2006/0205875 A1 | | 9/2006 | Cha et al. |
| 2006/0230937 A1 | * | 10/2006 | Smirnov et al. .................... 96/11 |
| 2006/0273067 A1 | * | 12/2006 | Smirnov et al. ................. 216/24 |
| 2007/0012355 A1 | | 1/2007 | LoCascio et al. |
| 2007/0082457 A1 | | 4/2007 | Chou et al. |
| 2007/0217008 A1 | * | 9/2007 | Wang et al. ................... 359/486 |
| 2008/0072958 A1 | | 3/2008 | Dutta |
| 2008/0119034 A1 | * | 5/2008 | Smirnov et al. ............... 438/606 |
| 2008/0128727 A1 | | 6/2008 | Erchak et al. |
| 2008/0135864 A1 | * | 6/2008 | David et al. ..................... 257/98 |
| 2008/0169479 A1 | | 7/2008 | Xu et al. |
| 2009/0118605 A1 | | 5/2009 | Van Duyne et al. |
| 2009/0162966 A1 | | 6/2009 | Jawarani et al. |
| 2009/0214885 A1 | * | 8/2009 | Her et al. ....................... 428/544 |
| 2010/0110551 A1 | * | 5/2010 | Lamansky et al. ............ 359/599 |
| 2010/0171949 A1 | | 7/2010 | Mazur et al. |
| 2010/0195204 A1 | * | 8/2010 | Walker .......................... 359/507 |
| 2010/0276612 A1 | * | 11/2010 | Norwood et al. ......... 250/504 R |
| 2010/0300893 A1 | | 12/2010 | Suh et al. |
| 2011/0197959 A1 | * | 8/2011 | Catchpole et al. ............ 136/256 |
| 2011/0232744 A1 | | 9/2011 | Larsen et al. |
| 2011/0248386 A1 | | 10/2011 | Smirnov et al. |
| 2012/0176766 A1 | * | 7/2012 | Natsumeda ..................... 362/19 |
| 2012/0195335 A1 | * | 8/2012 | Kalosha et al. ............. 372/45.01 |
| 2012/0314189 A1 | * | 12/2012 | Natsumeda et al. ............ 353/20 |
| 2013/0057938 A1 | * | 3/2013 | Natsumeda et al. .......... 359/230 |
| 2014/0352779 A1 | * | 12/2014 | Smirnov et al. ............... 136/256 |
| 2015/0042988 A1 | | 2/2015 | Smirnov et al. |

FOREIGN PATENT DOCUMENTS

| | | | |
|---|---|---|---|
| RU | 2152108 C1 | | 6/2000 |
| RU | 2173003 C2 | | 8/2001 |
| RU | 2180885 C1 | | 3/2002 |
| RU | 2204179 C1 | * | 5/2003 |
| RU | 2231171 C1 | | 6/2004 |
| RU | 2240280 C1 | | 11/2004 |
| RU | 2321101 C1 | | 3/2008 |
| TW | 200939471 A | | 9/2009 |
| WO | 0017094 A1 | | 3/2000 |
| WO | WO 03032398 A2 | * | 4/2003 |
| WO | 2005050697 A2 | | 6/2005 |
| WO | 2010072862 A1 | | 7/2010 |
| WO | 2011044687 A1 | | 4/2011 |
| WO | 2012009467 A1 | | 1/2012 |

OTHER PUBLICATIONS

Supplementary European Search Report for EP Application No. 11870692.8 mailed Feb. 11, 2015.

International Search Report and Written Opinion for International Patent Application No. PCT/RU2011/000489 mailed Mar. 1, 2012.

International Search Report and Written Opinion for International Patent Application No. PCT/RU2011/000631 mailed Mar. 1, 2012.

International Search Report and Written Opinion for International Patent Application No. PCT/RU2011/00594 mailed Apr. 19, 2012.

International Search Report and Written Opinion for International Patent Application No. PCT/US2006/011420 mailed Jun. 26, 2008.

International Search Report and Written Opinion for International Patent Application No. PCT/US2006/021564 mailed Jul. 28, 2008.

Karen, A. et al., "Quantitative Investigation of the O2+-Induved Topography of GaAs and other III-V Semiconductors: an STM Study of the Ripple Formation and Suppression of the Secondary Ion Yield Change by Sample Rotation," Surface and Interface Analysis, vol. 23, 1995, pp. 506-513.

Scott, K.L. et al., "Pattern Generators and Microcolumns for Ion Beam Lithography," Journal of Vacuum Science Technology B, 18(6) 2000, pp. 3172-3176.

Vajo, J.J. et al., "Influence of O2+ Energy, Flux, and Fluence on the Formation and Growth of Sputtering-Induced Ripple Topography on Silicon," Journal of Vacuum Science and Tecnology A. 14(5), 1996, pp. 2709-2720.

Official Communication for U.S. Appl. No. 11/421,384 mailed Aug. 21, 2008.

Official Communication for U.S. Appl. No. 11/421,384 mailed Apr. 24, 2009.

Official Communication for U.S. Appl. No. 11/421,384 mailed Sep. 3, 2009.

Official Communication for U.S. Appl. No. 13/164,387 mailed Sep. 6, 2012.

Official Communication for U.S. Appl. No. 12/407,615 mailed Mar. 28, 2014.

European Search Report for European Application No. 06851545.1 mailed Feb. 8, 2010.

Official Communication for U.S. Appl. No. 13/859,442 mailed Oct. 18, 2013.

Official Communication for U.S. Appl. No. 13/859,442 mailed May 2, 2014.

Official Communication for U.S. Appl. No. 13/859,442 mailed Mar. 27, 2014.

Official Communication for U.S. Appl. No. 11/100,175 mailed Oct. 24, 2007.

Official Communication for U.S. Appl. No. 11/100,175 mailed May 16, 2008.

Official Communication for U.S. Appl. No. 11/100,175 mailed Feb. 9, 2009.

(56) References Cited

OTHER PUBLICATIONS

Chapter 7 in the book Sputtering by Particle Bombardment II: Sputtering of Alloys and Compounds, Electron and Neuron Sputtering, Surface Topography, Edited by R. Behrisch, 1983, Springer-Verlag, Berlin-Heidelberg-New York-Tokyo.

Mishra et al. Effect of initial target surface roughness on the evolution of ripple topography induced by oxygen sputtering of Al films, Journal of Applied Physics, vol. 105, 2009, 7 pages.

International Search Report and Written Opinion for PCT/RU2011/000977 mailed Sep. 6, 2012.

International Search Report and Written Opinion for PCT/RU2012/000016 mailed Sep. 13, 2012.

International Search Report and Written Opinion for PCT/RU2012/000210 mailed Dec. 20, 2012.

International Search Report and Written Opinion for PCT/RU2014/000458 mailed Feb. 5, 2015.

* cited by examiner

LIGHT EMITTING DIODE WITH NANOSTRUCTURED LAYER AND METHODS OF MAKING AND USING

CROSS REFERENCE TO RELATED APPLICATIONS

This utility patent application is a continuation of and claims priority to PCT Patent Application No. PCT/RU2011/000594 filed Aug. 5, 2011, the benefits of which are claimed under 35 U.S.C. §120 and 35 U.S.C. §365(c), which is incorporated herein by reference.

FIELD

The invention relates to the field of semiconductor devices for converting electrical energy into light energy, in particular to the field of solid state light emitting diodes. The invention also relates to the technology of forming nanostructured elements on the surface of semiconductor wafers to produce light emitting diodes.

BACKGROUND

In at least some arrangements, light emitting diodes (LEDs) have an active layer of semiconductor material sandwiched between n-type and p-type semiconductor doped layers. When a voltage is applied between the doped layers, an electric current is passed through the LED. Charge carriers, electrons from n-layer or holes from p-layer, are injected into the active layer where they recombine to generate light. The light generated by the active region emits in all directions and escapes the LED through all exposed surfaces (light emitting surfaces). The efficiency of LEDs is limited by the phenomenon of total internal reflection (TIR) in which a part of the light is reflected from the light emitting surface back into the LED and is lost due to light absorption. The greater the difference in refractive indices (n) of the materials at the light emitting surface compared to the environment to which the light exits (n=1.0 for air and n≈1.5 for epoxy), the stronger the negative impact of TIR. Typical semiconductor materials have a relatively high index of refraction (n≈2.2-3.8); therefore, much of the light generated by the active layer of the LED is blocked by the light emitting surface.

Green, blue, and ultraviolet LEDs can be manufactured, for example, with gallium nitride (GaN) epitaxially grown on substrates of sapphire ($Al_2O_3$), silicon carbide (SiC), silicon (Si), SiC-on-insulator (SiCOI), Si-on-insulator (SOI), or the like. Infrared, red, and yellow LEDs can be manufactured, for example, with ternary or quaternary compounds of $A_3B_5$ (Al,Ga,In)(P,As) grown on substrates of gallium arsenide (GaAs) or indium phosphide (InP). These compounds can include, in particular, aluminum containing semiconductor compounds from a group including AlAs, AlGaAs, AlGaInP, AlGaN, and AlGaInN.

The growth substrate is sometimes removed to improve the optical characteristics and to reduce the resistance of LED layers. A sapphire substrate, for example, can be removed by laser melting of GaN at the GaN/sapphire interface, and silicon and gallium arsenide substrates can be removed, for example, by selective wet etching.

One method for reducing TIR loss includes depositing on a growth substrate an n-type layer, an active layer, and a p-doped layer, forming a conductive substrate above the p-doped layer, removing the growth substrate to expose the n-doped layer, followed by photo-electrochemical (PEC) oxidation and etching of the n-doped layer to form a roughened surface to enhance the light extraction. A 2-fold increase in LED light extraction has been achieved by this method compared to an LED with a flat, light emitting surface. One disadvantage of this method is that a random distribution of roughness amplitude, up to 0.5 μm, can lead to a nonuniform distribution of current over the surface due to thickness nonuniformity in the n-type layer, which is often critical for thin-film LEDs with the n-type layer thinner than 2-3 μm.

One method for manufacturing thin-film LEDs includes growing the first and second epitaxial layers of different conductivity types with an active layer between them on a growth substrate, providing a package substrate with contact pads for the first and second epitaxial layers of individual LEDs, bonding the second epitaxial layer to the contact pads of the package substrate using a metal interface, removing the growth substrate, etching the exposed surface of the first epitaxial layer such that the LED layers have a thickness less than 10 μm or less than 3 μm, forming light extraction features in the primary emission surface to enhance the light extraction from an exposed light emitting surface of the first epitaxial layer which includes of roughening, patterning, and dimpling the primary emission surface, or forming a photonic crystal. The efficiency of a thin-film LED was enhanced both by surface features and by thinning the layers, removing the substrate absorbing the part of the light, making the reflecting contact at the side of the mounting substrate, and lowering the LED heating due to heat removal into the mounting substrate. However, the creation of micron- and submicron-sized roughness with a random profile is not consistent with the trend of thinning LED layers down to a total LED thickness of less than 3 μm.

BRIEF SUMMARY

One embodiment is a light emitting diode having a plurality of layers including at least two layers. A first layer of the plurality of layers has a nanostructured surface which includes a quasi-periodic, anisotropic array of elongated ridge elements having a wave-ordered structure pattern, each ridge element having a wavelike cross-section and oriented substantially in a first direction.

Another embodiment is a device including the light emitting diode describe above.

Yet another embodiment is a hard nanomask having a plurality of elongated elements formed from an aluminum-containing semiconductor material, other than pure aluminum nitride, and disposed in a quasi-periodic, anisotropic array having a wave-ordered structure pattern and a wavelike cross-section. At least some of the elongated elements having the following structure in cross-section: an inner region of the aluminum-containing semiconductor material and a first outer region containing aluminum nitride covering a first portion of the inner region.

A further embodiment is a method of making a light-emitting semiconductor device. The method includes depositing a layer of amorphous silicon on a surface of an aluminum-containing semiconductor layer; irradiating a surface of the amorphous silicon with an oblique beam of nitrogen ions to form a wave-ordered structure in the layer of amorphous silicon; and further irradiating the surface of the amorphous silicon with an oblique beam of nitrogen ions to transfer the wave-ordered structure to a surface of the aluminum-containing semiconductor layer forming a nanomask. The nanomask includes a quasi-periodic, anisotropic array of elongated elements having a wave-ordered structure pattern and a wavelike cross-section.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description, which is to be read in association with the accompanying drawings, wherein:

FIG. 4A corresponds to the nanomask on a layer of amorphous silicon, according to the invention;

FIG. 4B corresponds to the nanomask on a layer of aluminum-containing semiconductor, according to the invention;

FIG. 4C corresponds to an intermediate metal nanomask on a surface of LED substrate, according to the invention;

FIG. 4D corresponds to an intermediate metal nanomask on a surface of transparent inorganic layer on LED substrate, according to the invention;

DETAILED DESCRIPTION

The invention relates to the field of semiconductor devices for converting electrical energy into light energy, in particular, to the field of solid state light emitting diodes (LEDs). The invention also relates to the technology of forming a nanostructure (type of topography) on the light emitting surface of LEDs. In at least some embodiments, the nanostructuctured surface may increase light output relative to an LED with the same structure, but no nanostructured surface. In at least some embodiments, the nanostructured surface may improve the quality of epitaxial semiconductor layers grown for the LED. The invention also relates to the use of a wavelike silicon nitride nanomask, which is self-forming during the irradiation of the surface of an amorphous silicon layer by a beam of nitrogen ions, as well as to the use of a wavelike nanomask based on aluminum nitride, which is self-forming during the irradiation of the surface of an AlGaAs layer by a beam of nitrogen ions. The invention also relates to the use of a wavelike nanomask based on aluminum nitride, which is formed during ion sputtering as a result of the transfer of a self-forming nanomask topography from a layer of amorphous silicon into an underlayer of a semiconductor compound containing aluminum. As a result of subsequent reactive ion etching (RIE) through the nanomask a dense quasi-periodic array of nanoelements with equal, or substantially equal, heights can be formed on the surface of LED substrates or on the light emitting surface of a LED. The period of the array is controllably varied from, for example, 20 to 150 nm or more, and the ratio of nanoelement height to the array period is varied from, for example, 0.5 to 5 or more.

Figure 6A:
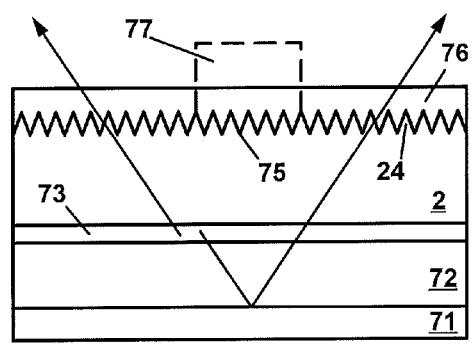
FIGS. 6A to 6D are cross-sectional views of different LED embodiments with nanostructured surfaces, according to the invention.

In general, a LED can be formed with a nanostructured surface. Preferably, the nanostructured surface is a light emitting surface. FIG. 6A shows one embodiment of a thin-film LED having an n-type GaN or AlGaN epitaxial layer 2, and a p-type GaN or AlGaN epitaxial layer 72, between which an undoped active layer 73 with one or more quantum wells is disposed. The layer 72 can be connected to a reflective silver-based contact metallization 71 through which the LED chip is bonded to a leadframe of an LED package. The light-emitting surface 75 of p-type layer 2 is nanostructured with an array of nanoridges 24 that scatters light and may increase the light output from the LED. Light rays emitting from emission region are shown by lines with arrows in FIGS. 6A to 6D. The light-emitting surface 75 is connected to a contact layer of transparent conductive oxide 76 or to a contact metallization 77. It will be recognized that other materials could be used for the layers illustrated in FIG. 6A.

Figure 6B:
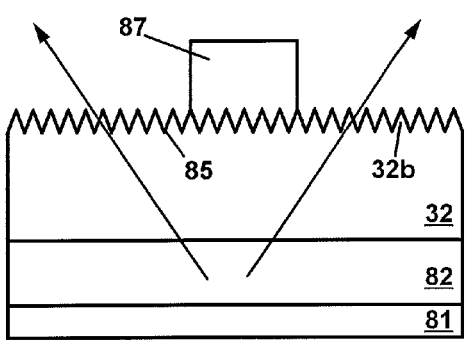

FIG. 6B shows one embodiment of a LED device with a primary light-emitting surface 85 on the back external side of the substrate 32 of, for example, silicon carbide. This LED includes contacts 81 and 87 between which a transparent conductive substrate 32 and a light emission region 82 are disposed. The emission region 82 includes semiconductor layers of opposite conductivity type between which an active layer is sandwiched that generates light when a voltage is applied to the contacts 81 and 87 and current flows through the LED. The surface 85 on the back external side of the LED substrate is nanostructured with an array of elements 32b that scatters the light and may increase the light output from the LED.

Figure 6C:
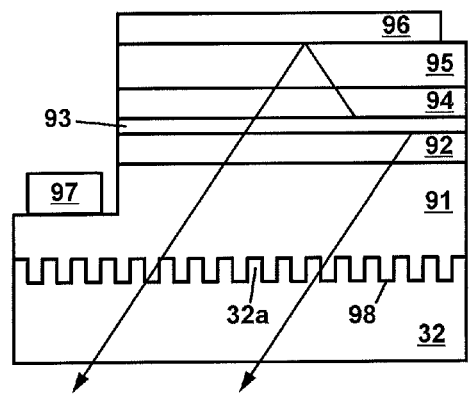

FIG. 6C shows one embodiment of a LED device having a nanostructured surface 98 with an array of elements 32a on the front internal side of a substrate 32 (for example, a sapphire substrate). For example, the LED includes an n-GaN layer 91, an n-AlGaN layer 92, an undoped active layer 93 with one or more quantum wells, a p-AlGaN layer 94, a p-GaN layer 95, and contact metallizations 96 and 97.

Figure 6D:
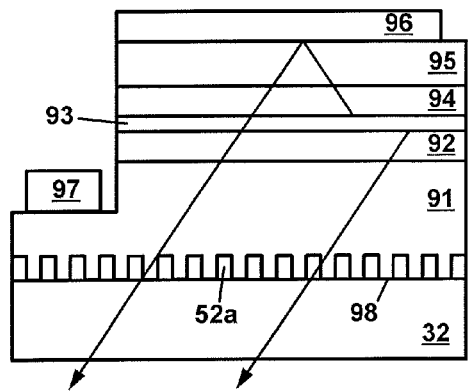

FIG. 6D shows an embodiment of an LED device that differs from the device shown in FIG. 6C in that the elements 52a are made of a transparent inorganic material. Nanostructured surface 98 in FIGS. 6C to 6D is designed to improve the quality of the epitaxial growth of n-GaN layers 91 and, preferably, to enhance the light scattering by the surface 98, which, preferably, allows increasing the internal quantum yield and light output from the n-GaN layer 91 into the substrate 32 and ultimately increasing the LED's efficiency. It will be recognized that any of the LED structures described above with respect to FIGS. 6A-6D can be made of using a variety of known semiconductor and other related materials.

Wave-ordered structures (nanomasks) can be formed on surfaces and substrates of LEDs by a broad ion beam. This equipment is produced, for example, by German company Roth & Rau AG. The size of the ion beam is sufficient for processing LED substrates of at least 50, 75, 100, and 150 mm in diameter. In specific example, the ion energy is up to 2 keV and the current density is 1 mA/cm$^2$. For 150-mm LED wafers, these parameters can provide the processing throughput of over 120 wafers per hour.

Methods of forming a nanomask on a silicon wafer are described in U.S. Pat. No. 7,768,018 and U.S. Patent Application Publication No. 2008/0119034, both of which are incorporated herein by reference. Ultra thin membranes based on wave-ordered structure patterns are described in U.S. Pat. No. 7,604,690, which is incorporated herein by reference. In at least some embodiments, a wavelike silicon nitride nanomask is formed by irradiation of the surface of a silicon wafer or silicon layer by a beam of nitrogen ions and then etching (e.g., wet etching or reactive ion etching) to create a nanostructured surface of the silicon in the form of a dense quasiperiodic array of nanoridges or nanopeaks. This nanomask can be used for fabricating LED devices from a wafer with a nanostructured surface. In at least some embodiments, the average period of the array is controllably varied in a range from 20 to 150 nm (or 20 to 180 nm or 20 to 200 nm) to increase the performance of LED devices. This process is reliably reproducible and forms a uniform wavelike silicon nitride nanomask, as well as a nanostructure on the surface of silicon.

A wavelike hard nanomask can also be formed by a beam of nitrogen ions in layers of both amorphous silicon and aluminum-containing semiconductor materials, other than pure aluminum nitride AlN, including those in the group that includes AlAs, AlGaAs, AlGaInP, AlGaN, and AlGaInN. The nanomask can be used for nanostructuring a LED light emitting surface or a surface of a growth substrate for LEDs. Nanostructured surfaces can include one or more quasi-periodic arrays of nanoelements having wave-ordered structure pattern and can be formed by methods of selective etching, both wet and dry, including reactive ion etching (RIE.) The period of the array is controllably varied from 20 to 150 nm or more.

These methods and structures described herein can provide a reliably reproducible and uniform wavelike nanomask for nanostructuring a LED light emitting surface or a surface of a growth substrate of up to 150 mm or more in diameter for LEDs. A nanostructure having a wave-ordered structure pattern on a LED light emitting surface or on a surface of growth substrates for LEDs can be manufactured using broad ion beams and RIE plasma systems used in modern industry.

One embodiment is a hard nanomask having a plurality of elements as a quasi-periodic, anisotropic array of elongated elements having a wave-ordered structure pattern and a wavelike cross-section. At least some of the elements have the following structure in cross-section: an inner region of aluminum-containing compound semiconductor, other than pure aluminum nitride, and a first outer region containing aluminum nitride covering a first portion of the inner region and being formed from the aluminum-containing semiconductor material using a nitrogen ion beam. In at least some embodiments, the first outer regions of the elements form a net-like or an island-like structure or a combination thereof. In at least some embodiments, the period of the array is in a range from 20 to 150 nm or more. In at least some embodiments, the aluminum-containing semiconductor material is one of the following: AlAs, AlGaAs, AlGaInP, AlGaN, or AlGaInN.

In at least some embodiments, the nanomask also includes a second outer region containing aluminum nitride being formed from an aluminum-containing semiconductor material by a nitrogen ion beam, covering a second portion of the inner region, and connecting with the first outer region at a wave crest. The first outer region is substantially thicker than the second outer region. In at least some embodiments, the nanomask includes AlGaAs as the aluminum-containing semiconductor material and the processing method includes irradiating AlGaAs surface using an oblique beam of nitrogen ions until the nanomask is formed.

One embodiment is a method of forming a hard nanomask having a wave-ordered structure pattern on a surface of an aluminum-containing semiconductor, other than pure aluminum nitride. The method includes depositing a layer of amorphous silicon on the surface of the semiconductor, sputtering a surface of the amorphous silicon layer by an oblique beam of nitrogen ions until a wave-ordered structure is formed in the layer of amorphous silicon, further sputtering the amorphous silicon layer by the oblique beam of nitrogen ions until the topography of the wave-ordered structure is transferred on the surface of the semiconductor and a hard nanomask is formed. The nanomask has a quasi-periodic, anisotropic array of elongated elements with a wave-ordered nanostructure pattern and a wavelike cross-section. At least some of the elements have the following structure in cross-section: an inner region of the compound, a first outer region containing aluminum nitride covering a first portion of the inner region, and a second outer region containing aluminum nitride covering a second portion of the inner region and connecting with the first outer region at a wave crest, where the first outer region is substantially thicker than the second outer region and where aluminum nitride is formed from the compound by the nitrogen ion beam. In at least some embodiments, the first outer regions of the elements form a net-like or an island-like structure or a combination thereof. In at least some embodiments, the period of the array is in a range from 20 to 150 nm or 20 to 200 nm. In at least some embodiments, the aluminum-containing semiconductor is one from the group that includes AlAs, AlGaAs, AlGaInP, AlGaN, and AlGaInN.

In at least some embodiments, for a beam of nitrogen ions with N$^+$ ions and N$_2^+$ ions in the relative fractions of x and (1−x), respectively, the nanomask average period, the nanomask formation depth, and the ion dose to form the nanomask are (1+x) times greater than those for a N$_2^+$ ion beam.

In at least some embodiments, etching a hard nanomask is performed until the second outer regions of the elements are removed. In at least some embodiments, etching is performed as a wet etch in a liquid solution, or a dry etch in plasma, or an ion beam etch.

One embodiment is a light emitting diode including layers of materials, at least one of which has a surface where at least a portion of the surface has a nanostructure having a quasi-periodic, anisotropic array of elongated elements along the surface, the elongated elements having a wave-ordered structure pattern and being substantially equal in cross-section shape and in height. In at least some embodiments, at least some of the elongated elements form a net-like or an island-like structure or a combination thereof. In at least some embodiments, the period of the quasi-periodic array is in a range from 20 to 150 nm or 20 to 200 nm. In at least some embodiments, the elongated element height to array period ratio is in the range from 0.5 to 5. In at least some embodiments, the surface is a light emitting surface of semiconductor material and the surface includes the nanostructure to enhance light extraction. In at least some embodiments, the semiconductor material is one of the group that includes $A_3B_5$ compounds that include gallium phosphide (GaP) or gallium arsenide (GaAs), and III-N compounds that include gallium nitride (GaN).

In at least some embodiments, the surface is a light emitting surface on the back external side of the substrate and the surface includes the nanostructure to enhance light extraction. In at least some embodiments, the surface is a surface on the front internal side of the substrate, on which a layer of semiconductor material is disposed and which includes the nanostructure to enhance light extraction and to improve the quality of epitaxy of the semiconductor material. In at least some embodiments, the surface is a surface on the front internal side of the substrate and the elongated elements are formed from a layer of transparent inorganic material and disposed between the substrate and the layer of semiconductor material, and the substrate is connected with semiconductor material between the elongated elements.

In at least some embodiments, the substrate is made of an inorganic crystal, which is one of the group that includes sapphire ($Al_2O_3$), silicon (Si), silicon carbide (SiC), spinel ($MgAl_2O_4$), neodymium gallate ($NdGaO_3$), lithium gallate ($LiGaO_2$), zinc oxide (ZnO), magnesium oxide (MgO), A3B5 compounds that include gallium phosphide (GaP) or gallium arsenide (GaAs), and III-N compounds that include gallium nitride (GaN). In at least some embodiments, the substrate is made of an inorganic crystal and the elements are substantially oriented in one direction with respect to the substrate crystal.

One embodiment is a substrate for a light emitting diode, at least one side of which has a surface, at least a portion of the surface having a nanostructure including a quasi-periodic, anisotropic array of elongated elements along the surface, the elongated elements having a wave-ordered nanostructure pattern, and being substantially equal in cross-section shape and in height. In at least some embodiments, at least some of the elongated elements form a net-like or an island-like structure or a combination thereof. In at least some embodiments, the period of the quasi-periodic array is in a range from 20 to 150 nm or 20 to 200 nm. In at least some embodiments, the elongated element height to array period ratio is in the range from 0.5 to 5. In at least some embodiments, the elongated elements are formed from a layer of transparent inorganic material and disposed on the substrate surface, and the substrate is exposed between the elongated elements.

In at least some embodiments, the substrate is made of an inorganic crystal, which is one of the group that includes sapphire ($Al_2O_3$), silicon (Si), silicon carbide (SiC), spinel ($MgAl_2O_4$), neodymium gallate ($NdGaO_3$), lithium gallate ($LiGaO_2$), zinc oxide (ZnO), magnesium oxide (MgO), A3B5 compounds that include gallium phosphide (GaP) or gallium arsenide (GaAs), and III-N compounds that include gallium nitride (GaN). In at least some embodiments, the elongated elements are substantially oriented in one direction with respect to the substrate crystal.

For a wavelike hard nanomask having a wave-ordered structure pattern with a period in the range from 20 to 150 nm or more and self-assembled on a silicon surface by an oblique beam of nitrogen ions, it has been found that an outer region of the nanomask element, which is irradiated by the beam of nitrogen ions at an angle θ of, for example, about 70° with respect to its normal, is made of silicon nitride (SiN) if the nanomask is not exposed to air after its formation by the beam of nitrogen ions in vacuum. After exposure to air, a small amount of silicon oxynitride inclusions is additionally produced in the outer region. The thickness of the outer region may not be constant in cross-section and can be smallest in the middle between its borders and increasing in the direction of its edges.

In at least some embodiments, for nitrogen ions $N_2^+$, the thickness of the first outer SiN region that is irradiated by nitrogen ion beam at angle θ of about 15° with respect to its normal is determined by the formula: T(nm)=2E(keV), where T is the thickness of the first outer region, nm, and E is the energy of ions $N_2^+$ keV. In at least some embodiments, for atomic nitrogen ions $N^+$, the thickness of the first outer region is two times greater than that for molecular ions $N_2^+$. In some embodiments, the nanomask period for the ions $N^+$ is also two times higher than for the ions $N_2^+$. A beam of $N^+$ ions with energy E/2 and a beam of $N_2^+$ ions with energy E form nanomasks with the same period and same thicknesses of the first outer regions. For a beam of nitrogen ions having an x fraction of $N^+$ ions and a (1–x) fraction of $N_2^+$ ions, the nanomask period and the thickness of the first outer region have values that are (1+x) times greater than those for a beam of $N_2^+$ ions. One feature of the pattern of the wavelike hard nanomask of silicon nitride on silicon is that the regions (opposite wave slopes) form an island-like or a net-like structure or a combination thereof. In addition, the nanomask does not contain repetitive identical elements with a length of at least not less than 5 periods of the array and does not contain repeating parts of the array with the same relative positions of the elements, which is due to the self-forming nature of the nanomask.

In at least some embodiments, the phenomenon of self-forming generates a hard wavelike nanomask with controllable period in the range 20 to 150 nm or more on the surface of AlGaAs, an aluminum-containing semiconductor, formed by an oblique beam of nitrogen ions with energies in the range of, for example, 0.5 to 8 keV. It was found in specific examples that the wave slopes of the nanomask are ~30° tilted with respect to the nanomask plane; the first outer region of the nanomask element having been irradiated by a beam of nitrogen ions at an angle of about 15° with respect to its normal, like the second outer region of the nanomask element having been irradiated by a beam of nitrogen ions at an angle of about 70° with respect to its normal, contains ion-synthesized aluminum nitride (AlN). This nanomask is of high contrast due to the significant difference in thickness between the first and second outer regions, which opens up the possibility of using selective methods for its etching.

In at least some embodiments, under similar conditions of irradiation by nitrogen ions, the thickness of the first region containing AlN in the nanomask on $Al_{0.2}Ga_{0.8}As$ is approximately 2 times smaller than the thickness of the first region of SiN in a nanomask formed on silicon. Also in the case of self-forming nanomask on AlGaAs, for a beam of nitrogen ions having an x fraction of $N^+$ ions and a (1–x) fraction of $N_2^+$ ions, the nanomask period and the thickness of the first outer region have values that are (1+x) times greater than those for a beam of $N_2^+$ ions. One feature of the pattern of the wavelike hard nanomask on AlGaAs is that the regions form an island-like or a net-like structure or a combination thereof. In addition, the nanomask does not contain repeating parts of the array with the same relative positions of the elements, which is due to the self-forming nature of the nanomask. It may differ in higher ordering of the pattern compared to a self-forming nanomask on silicon.

In addition, it was found that the wavelike hard nanomask can be created in a layer of aluminum-containing semiconductor from the group that includes AlAs, AlGaAs, AlGaInP, AlGaN, and AlGaInN through the transfer of the topography of a self-forming wavelike nanomask from a layer of amorphous silicon into the specified aluminum-containing layer during a sputtering process with nitrogen ions. In this case the first and second outer regions of the nanomask element contain ion-synthesized aluminum nitride (AlN). Depending on the ratio of $N^+$ and $N_2^+$ components in the ion beam, the thickness of the first region of nanomask elements and its period obey the regularity described above for the nanomask on AlGaAs.

Figure 1A:
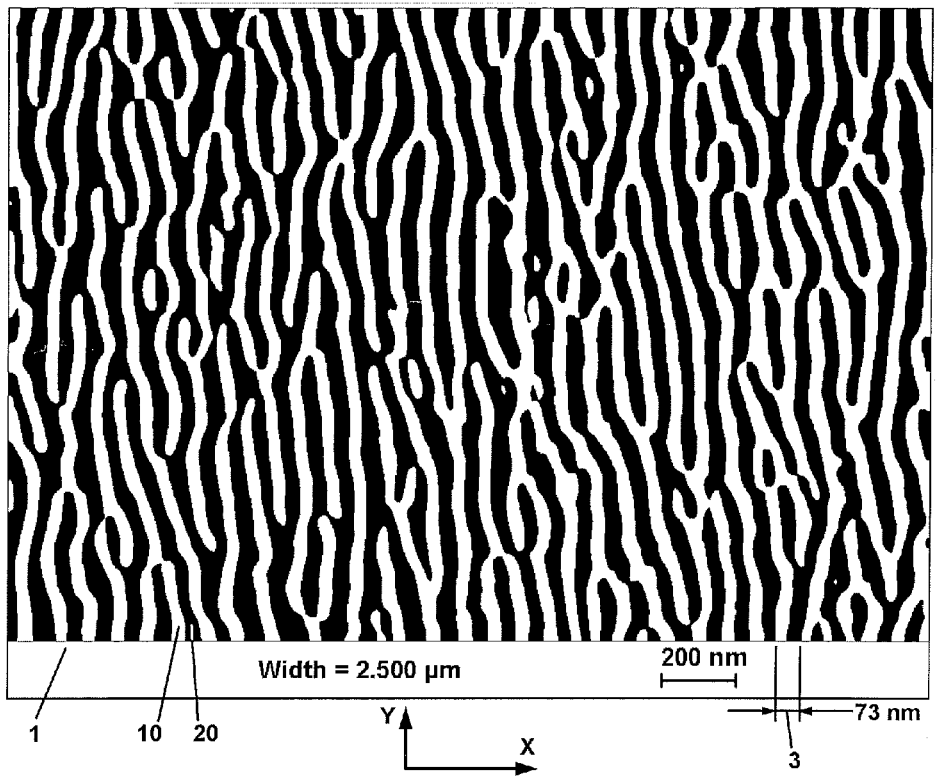
FIG. 1A is a scanning electron microscope (SEM) top view of a hard nanomask having a period of 73 nm and formed on a surface of aluminum gallium arsenide (AlGaAs) by a $N_2^+$ ion beam with energy E=5 keV at an angle of bombardment θ=53° from surface normal, according to the invention.

FIG. 1A is a SEM image with enhanced contrast (without halftones, top view) of a self-forming wave-ordered structure (WOS) on the surface of an aluminum gallium arsenide (AlGaAs) layer. This particular example is a wavelike hard nanomask 1 with an average period 3 (wavelength $\lambda$=73 nm). The width of the SEM image is 2.5 µm. White stripes 10 and black stripes 20 are the opposite slopes of the WOS waves.

Figure 1B:
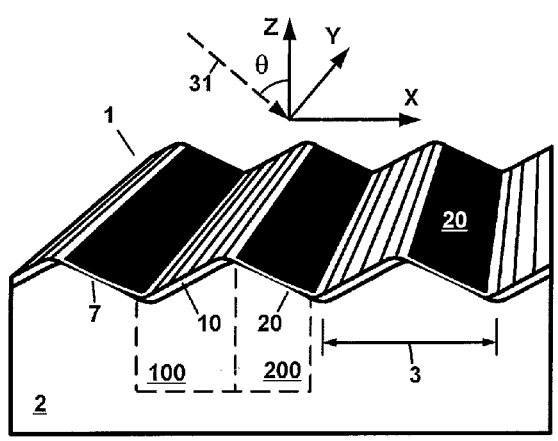
FIG. 1B is a perspective and cross-sectional view of one embodiment of elongated elements of a hard nanomask, according to the invention.

FIG. 1B is a perspective view of a WOS region with a cross section of waves in the XZ plane on the surface of AlGaAs 2. The location of the wave slopes 10 and 20 and their orientation are the same as in FIG. 1A, corresponding to the XY plane. Wave crests are on average parallel to the Y axis, i.e., the array of waves is anisotropic. A single wave (nanomask element) in the cross-section includes an inner region of AlGaAs that further includes a first part 100 of the inner region and a second part 200 of the inner region and an outer region that further includes the first part 10 of the outer region containing aluminum nitride (AlN) and the second part 20 of the outer region also containing aluminum nitride. Regions 10 and 20 are formed from AlGaAs by a beam of nitrogen ions $N_2^+$ with energy in the range from, for example, 1 to 8 keV in vacuum during nanomask formation and are connected to each other at a wave crest or peak. In this particular example, the slopes of the waves of nanomask 1 are about 30° tilted relative to the XY plane of the array of waves.

As seen in FIG. 1A, waves of nanomask 1 have breaks, bends, and branches, i.e. joints with each other. Generally the waves are elongated along the Y axis and elongated elements have length in the range from $10\lambda$ to $30\lambda$. At the same time there are waves having more or less elongation as well as subwavelength pointlike elements with a size of less than $\lambda$. In general, the array of waves is quasi-periodic and the pattern of waves is uniform, and one can reproduce these arrays with the same average period in a range from 20 to 150 nm or more and the same average elongation of waves under the same conditions of self-formation. However, repetitive waves with elongation of greater than $5\lambda$ and repetitive parts of the array with the same relative positions of the waves cannot generally be formed due to the self-forming nature of the nanomask.

A characteristic feature of the topology of nanomask 1 in FIG. 1A is that the regions 10 of some elongated elements are connected to each other, and regions 20 of some elongated elements are also connected in a branched structure or a mesh. At the same time there are both separated regions 10 and separated regions 20.

In at least some embodiments, regions 10 in the XZ section plane at the borders have a beaklike shape. The thickness of region 20 in its cross-section in XZ plane may be smallest at the middle point 7 between the regions 10 and gradually increase towards the regions 10.

The nanomask shown in FIGS. 1A to 1B can be formed on the AlGaAs surface by a beam of nitrogen ions $N_2^+$. In one example, a nanomask can be formed with a beam of nitrogen ions $N_2^+$ having energy of 5 keV and directed in the XZ plane along the arrow 31 obliquely at an angle $\theta$=53° from Z axis. The projection of the ion flow 31 on the XY plane is along X axis. During sputtering of AlGaAs by nitrogen ions, a self-forming process occurs that results in the formation of wavelike nanomask 1 at the sputtering depth $D_F$=130 nm from the initial level of AlGaAs surface. Regions 10 are bombarded by nitrogen ions at near normal angles, and regions 20 are bombarded at glancing angles of about 70° or larger, which may determine, at least in part, the thickness of regions 10 and 20. Crests of nanomask waves in an array are predominantly oriented perpendicular to the projection of the $N_2$ ion flow on the surface of AlGaAs, i.e., perpendicular to the X axis. With decreasing ion energy and increasing ion bombardment angle $\theta$ measured from surface normal (Z axis), the wavelength $\lambda$ or period 3 of the array is reduced. As an example, in at least some embodiments ion energy in a range from 1 to 8 keV corresponds to a range of nanomask period from 20 to 150 nm. In at least some embodiments, the topology of nanomask 1 does not change for the bombardment angles in the range $\theta$=45°-55°.

Figure 1C:
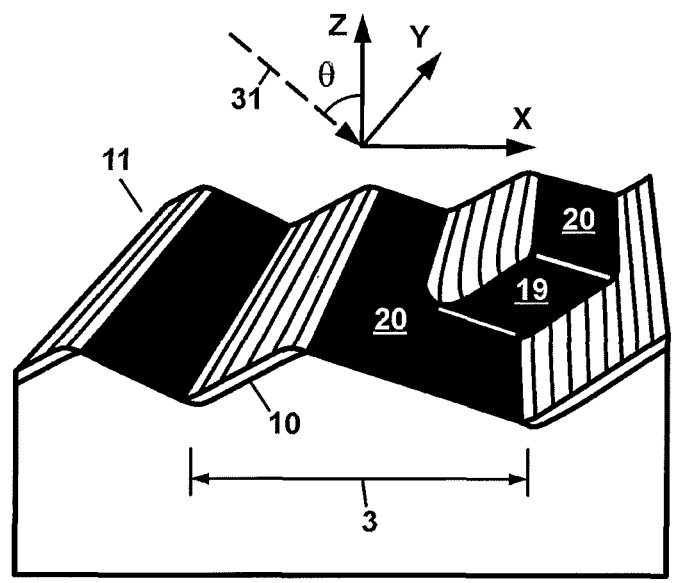
FIG. 1C is a perspective and cross-sectional view of another embodiment of elongated elements of a hard nanomask with a wave break, according to the invention.

FIG. 1C shows a wave break 19. End surfaces of the illustrated wave breaks 19 were irradiated by a beam of nitrogen ions at grazing angles of about 70° or greater; therefore they have the same thickness as regions 20 and connect regions 20 in a net-like structure.

Figure 1D:
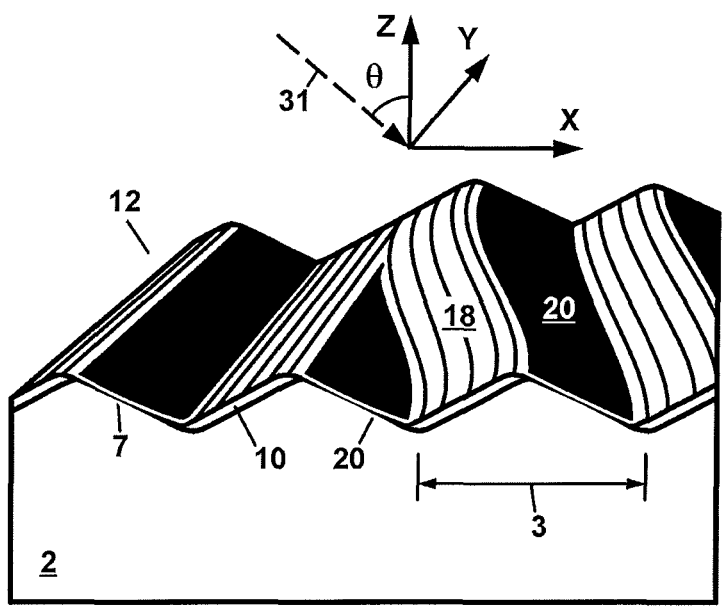
FIG. 1D is a perspective and cross-sectional view of yet another embodiment of elongated elements of a hard nanomask with a joint between two waves, according to the invention.

FIG. 1D shows a wave joint 18. The surfaces of the illustrated joints of waves 18 were irradiated by a nitrogen ion beam at an angle of less than 30°, therefore they have the same thickness as regions 10, and regions 18 may connect regions 10 in a net-like structure. The thickness of regions 18 is slightly smaller than the thickness of regions 10 located along the Y axis.

Figure 1E:
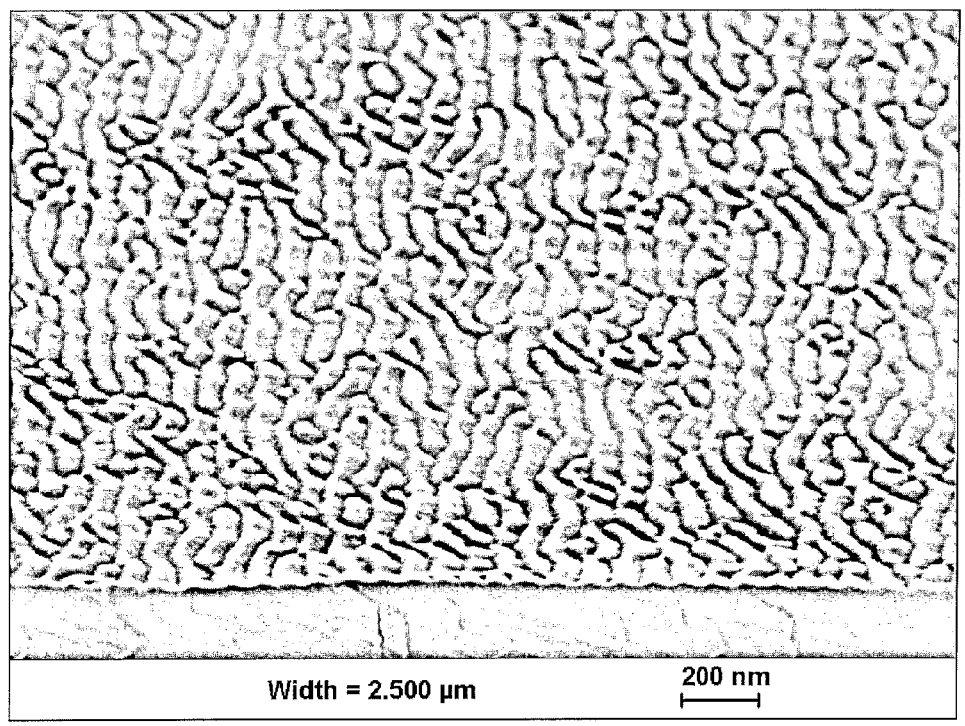
FIG. 1E is an SEM 70° angled view of a hard nanomask having a period of 73 nm and formed on a surface of aluminum gallium arsenide (AlGaAs) by a $N_2^+$ ion beam with energy E=5 keV at an angle of bombardment θ=53° from surface normal, according to the invention.

FIG. 1E shows a SEM 70° angled view of a cleft hard nanomask on a surface of aluminum gallium arsenide (AlGaAs), which is shown in FIG. 1A. The image width is 2.5 µm. It is seen in the cleft that the surface of AlGaAs is non-planar with the vertical size of roughness of 100 nm and the horizontal size of 2 µm. The wave shape in cross-section is seen as well.

Figure 2A:
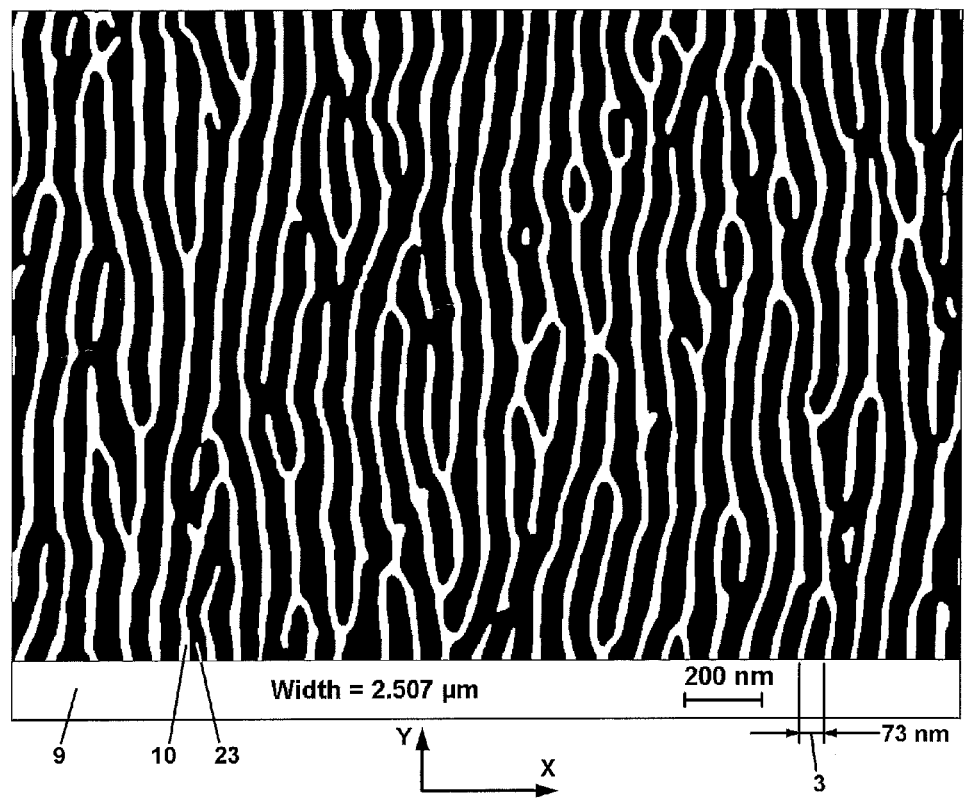
FIG. 2A is an SEM top view of a hard nanomask having a period of 73 nm and formed on a surface of AlGaAs by a $N_2^+$ ion beam with energy E=5 keV at an angle of bombardment θ=53° from surface normal, which was subjected to wet etching, according to the invention.

FIG. 2A shows an SEM image with enhanced contrast (without halftones, top view) of a modified nanomask 9 with a quasi-periodic array of crest-like waves with regions 10b on the surface (white stripes) spaced by trenches 23 (black stripes). In this example, the average period 3 of the array is 73 nm (wavelength $\lambda$=73 nm). The width of the SEM image is 2.5 µm.

Figure 2B:
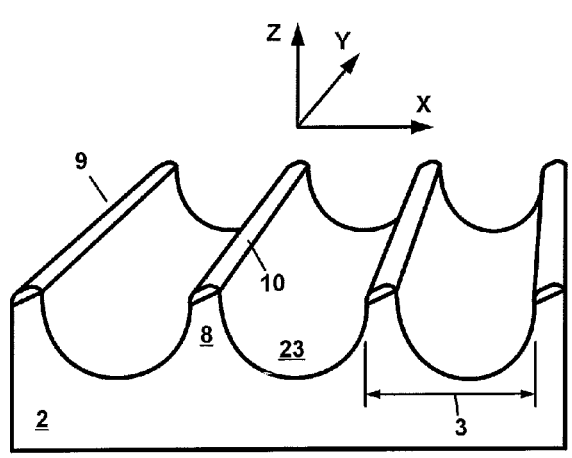
FIG. 2B is a perspective and cross-sectional view of one embodiment of elongated elements of a hard nanomask which was subjected to wet etching, according to the invention.

FIG. 2B shows a cross-section of crest-like waves (elongated elements) of a nanomask 9 in the XZ plane. The array elements are projections 8 elongated along the Y axes and spaced by trenches 23. The projections 8 include a lower region 2 of AlGaAs and an upper region 10b containing aluminum nitride (AlN) that was formed from AlGaAs by a nitrogen ion beam $N_2^+$. Upper regions 10b are disposed obliquely relative to the XY plane of the array.

Figure 2C:
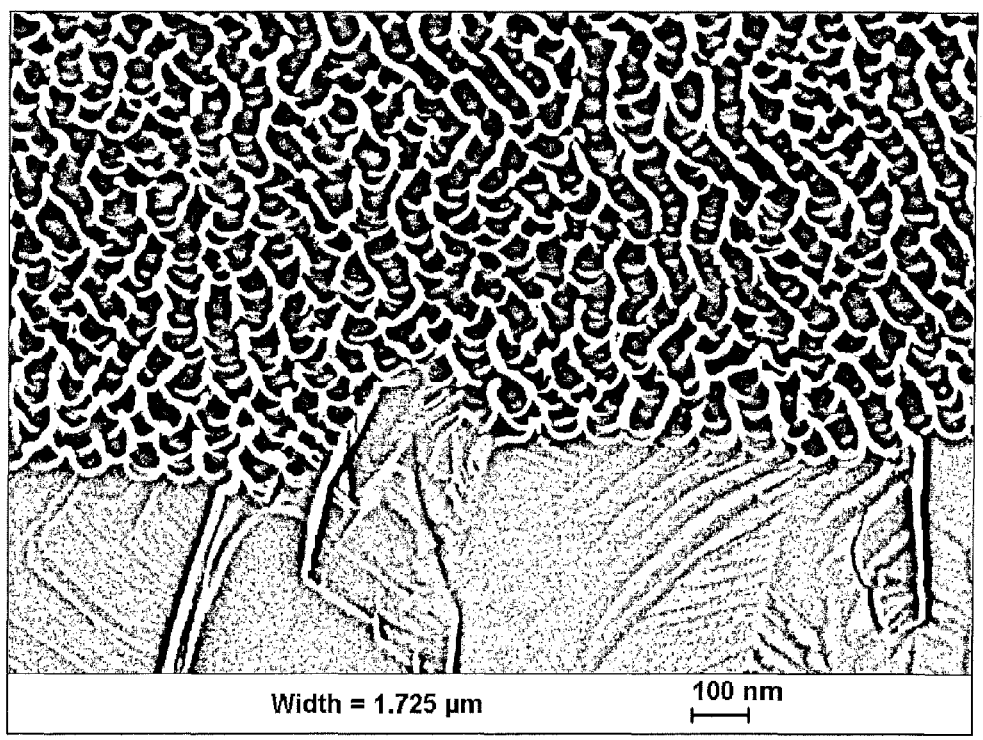
FIG. 2C is an SEM 70° angled view of a hard nanomask having a period of 73 nm and formed on a surface of AlGaAs by a $N_2$ ion beam with energy E=5 keV at an angle of bombardment θ=53° from surface normal, which was subjected to wet etching, according to the invention.

FIG. 2C shows a SEM 70° angled view of a cleft of a hard nanomask 9. Nanomask 9 shown in FIGS. 2A to 2C is obtained from nanomask 1 as a result of etching with removal of areas 20 and forming trenches 23 in their places in AlGaAs 2. In this case, a wet selective etching of AlGaAs with respect to AlN was implemented at room temperature in a solution containing $H_2SO_4$, $H_2O_2$, and water. In this isotropic etchant, the regions 10 of aluminum nitride are etched at a slower rate than AlGaAs. Therefore, nanomask 9 differs from nanomask 1 by the absence of regions 20 and by the presence of trenches 23 on their place. Due to the isotropy of the etching process, the ratio of the nanostructure height to its period (aspect ratio) is limited by the value of ~0.7 for this etchant.

The formation of nanomask 9 can be implemented by other known methods, both wet and dry, for selectively etching aluminum-containing semiconductors with respect to aluminum nitride such as, for example, reactive ion etching (RIE) in $Cl_2/BCl_3/N_2$ plasma. Depending on the etching mode, different cross-section shapes of elongated elements can be formed. Using RIE, the aspect ratio values of the structure can be varied in the range 1-5 due to the anisotropic nature of the etching process while providing sufficient selectivity.

Figure 3A:
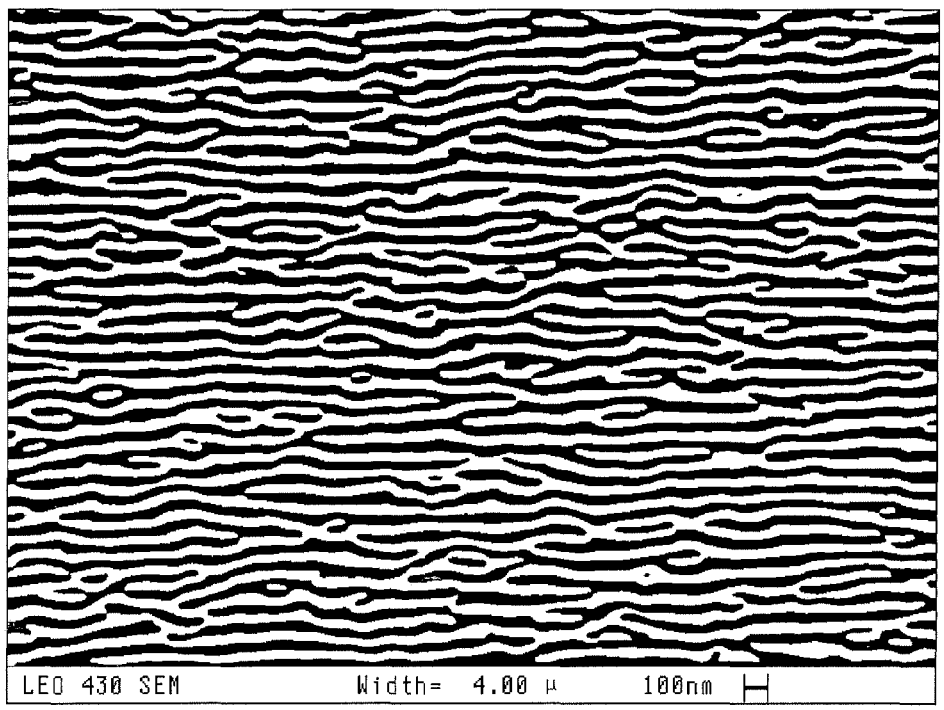
FIGS. 3A and 3B are corresponding SEM top views of nanostructured surfaces of silicon carbide (SiC) and sapphire ($Al_2O_3$) substrates with a period of quasi-periodic nanostructures of about 70 nm, according to the invention.

FIG. 3A shows a SEM top view of a quasi-periodic wavelike nanostructure on the surface of silicon carbide (SiC) with a period of about 70 nm, which was formed by transferring the topography of a wave ordered structure from a layer of amorphous silicon onto the SiC surface through sputtering by nitrogen ions. (For a general discussion of transferring the topography, see, for example, Smirnov V. K., Kibalov D. S., Method for Shaping Nanotopography on a Film Surface, Russian Patent RU2204179, incorporated herein by reference.) This method includes depositing a layer of amorphous silicon onto a film, sputtering amorphous silicon by a flow of nitrogen ions until a wave-ordered nanostructure is formed in the amorphous silicon layer, transferring a relief of the wave-ordered nanostructure onto a surface of the film by further sputtering the layer of amorphous silicon and the film with nitrogen ions. In this case, a monocrystalline SiC substrate served as the film.

Figure 3B:
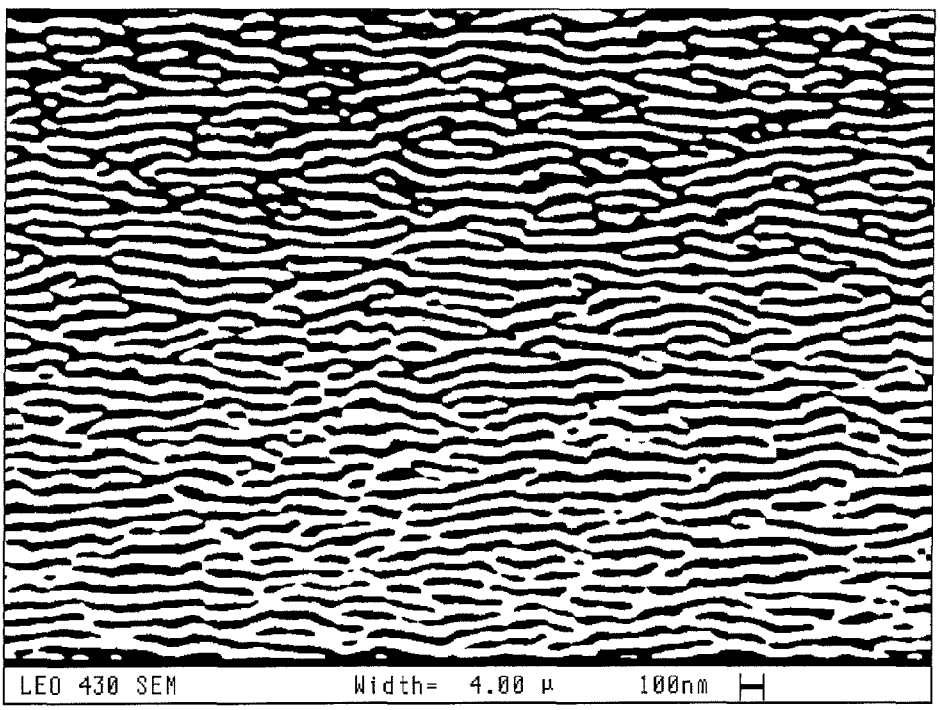

By the same method, a quasi-periodic wavelike nanostructure was formed on the surface of a monocrystalline sapphire substrate (FIG. 3B). It should be noted that the aspect ratio of nanostructures that are formed by transferring the topography of a wavelike nanostructure from the amorphous silicon layer into an underlayer material by ion sputtering is close to the aspect ratio of initial wavelike nanostructure of 0.33.

Figure 4A:
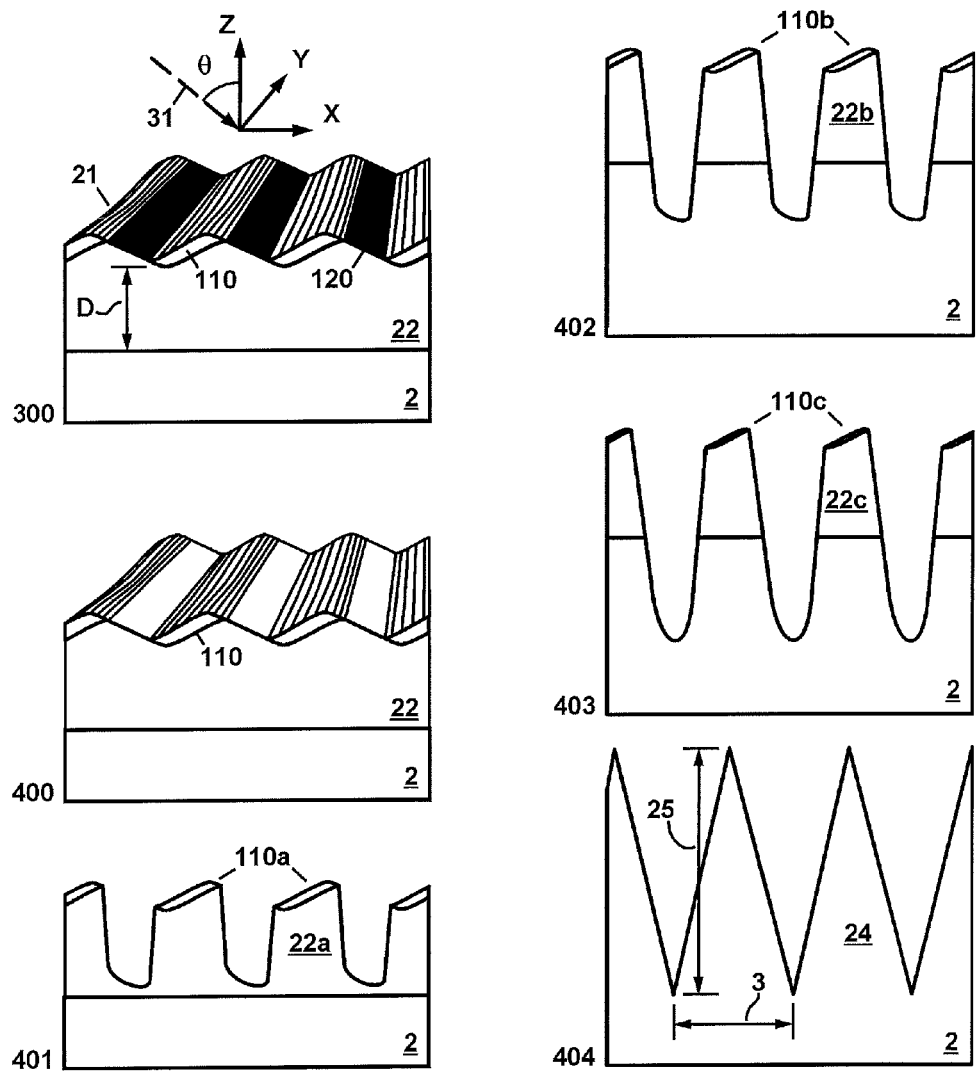
FIGS. 4A to 4D each include several perspective and cross-sectional views of sequential transformations of hard nanomasks into nanostructured surfaces by different methods of nanostructuring LED surfaces and LED substrates, according to the invention.

Increasing the aspect ratio of nanostructures is possible by selective etching using wavelike nanostructures as a nanomask as shown, for example, in FIGS. 4A to 4D. FIG. 4A illustrates steps of a method for nanostructuring the light-emitting surface of a layer 2 of LED material using a nanomask on the surface of an amorphous silicon layer. As a film, the layer 2 of LED material has a surface which is to be nanostructured to enhance light output of LEDs. A layer of amorphous silicon 22 is deposited on the surface of the layer 2; the surface of the layer 22 is irradiated by a flow of nitrogen ions 31 until a wave-ordered structure 21 is formed which has relatively thick elongated regions 110 and relatively thin elongated regions 120. Regions 110 and 120 are of silicon nitride and are formed from silicon by the beam of nitrogen ions. A wave-ordered structure 21, which is a nanomask, is formed at a distance D from the surface of the layer 2 as shown in the structure 300. The orientation of the nanomask elements (waves) in the XY plane is given by the direction of the ion flow 31 in the XZ plane. The direction of the projection of ion beam 31 onto the XY plane coincides with the direction of the X axis. Waves in the array are oriented along the Y axis perpendicular to the projection of the ion beam 31 on the XY plane.

Regions 120 are then removed thus enhancing the contrast of the nanomask 21. In at least one embodiment, this process takes about 2 seconds and allows one to significantly accelerate the etching of nanomask 1. It can be carried out in, for example, a non-selective $He/CHF_3$ plasma or in a selective (with respect to silicon nitride) $O_2/Cl_2$ plasma. In the latter case, the bias on the wafer that is etched is briefly risen, which provides a mode of ion sputtering of regions 120. As a result the structure 400 is formed.

Silicon is then etched, for example, by RIE using a chlorine $O_2/Cl_2$ plasma that is selective to nitride, resulting in the structures 401-404. In this plasma, both silicon and LED materials, for example, GaAs and AlGaAs are etched with a selectivity of at least 10 with respect to silicon nitride. Other known plasma mixtures, in which silicon and LED materials are etched selectively with respect to silicon nitride, may also be used. At the beginning of the etching of silicon 22, in the structure 401, the walls of the resulting trenches between the regions 110 of silicon nitride are etched vertically; then the etching process leads to a gradual reduction in the thickness and width of the regions 110 of silicon nitride (they are gradually transformed into the regions 110a, 110b and 110c). Thus, the walls of the regions 22a of amorphous silicon become sloped, as shown in the structure 401. During further etching, a layer of material 2 starts being etched; the width of the regions 22b of amorphous silicon becomes smaller, and the structure 402 is formed. The flow of plasma ions that are reflected down from the trench walls causes sharpening of the trench bottoms and the structure 403 is obtained with even more narrow regions 22c. After the complete removal of nanomask, i.e. regions 110c and 22c, the structure shape tends to a triangular profile as in the structure 404 with a quasi-periodic array of nanoridges 24 of material 2 having a sawtooth cross-section. Array period 3 coincides with the period of nanomask 21. Height 25 of nanoridges 24 is typically the same for all nanoridges in the array. The ratio of nanoridge height 25 to the array period 3 may vary in the range from 1 to 3.

Figure 4B:
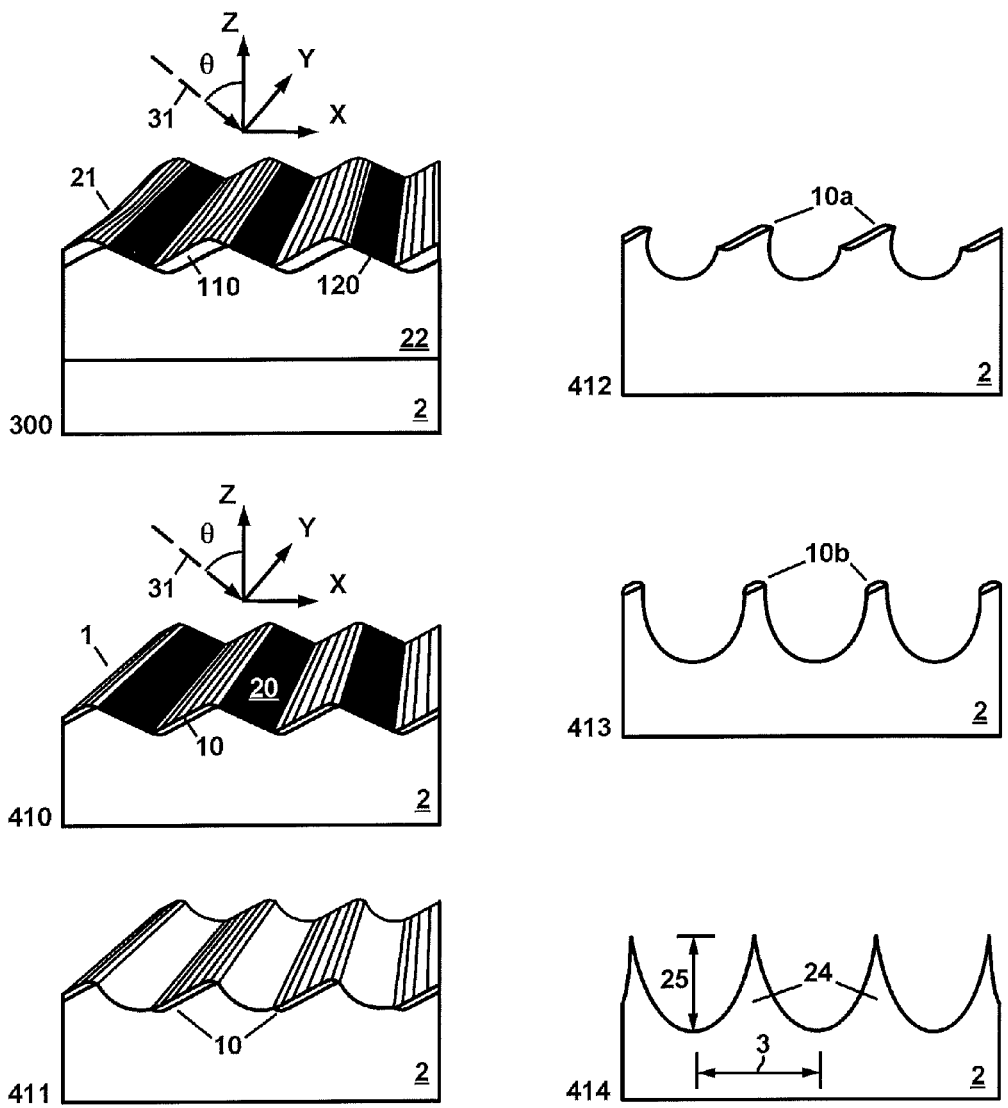

FIG. 4B illustrates steps of a method for nanostructuring a light-emitting surface of the layer 2 of LED material using a nanomask on the surface of a layer of an aluminum-containing semiconductor. In this method, the structure 300 during further sputtering of the layer 22 of amorphous silicon and the layer 2 of the LED material, for example, AlGaAs, by a flow of nitrogen ions 31 is transformed into the structure 410 that is a hard nanomask 1. In this case, in contrast to the wavelike topography, the nanomask 1 is formed on the surface of the aluminum-containing semiconductor 2. The nanomask 1 includes elongated regions 10 and 20 containing aluminum nitride (AlN) that is formed from the semiconductor 2 by a beam of nitrogen ions. Then this nanomask is etched using, for example, a wet etchant that is selective with respect to AlN. In the case of AlGaAs an example of a known etchant is $H_2SO_4/H_2O_2/H_2O$.

First, the regions 20 are removed, and the structure 411 is formed. As AlGaAs is etched, regions 10 are also etched and decrease in size (10a, 10b) but significantly slower than AlGaAs as shown in the structures 412 and 413. SEM views of the structure 413 (nanomask 9) are also shown in FIGS. 2A and 2C. Due to the isotropic nature of the etching the trenches between regions 10, 10a, and 10b may have a round cross-section. After etching of regions 10b, the structure 414 is obtained and includes an array of nanoridges 24a with sharp tops. In at least some embodiments, in the case of isotropic wet etching, the ratio of nanoridge height 25 to the array period 3 does not exceed 1.0.

It should be noted that the hard nanomask 1 can be formed not only by transferring the topography of wave-ordered structure from a layer of amorphous silicon into the underlayer of AlGaAs, but also directly in the AlGaAs layer in the process of self-formation upon irradiation of this layer by a flow of nitrogen ions. However, in the latter case, the thickness of the AlGaAs layer should be increased by a depth of the structure formation (~200 nm). Upon transferring the topography of the wave-ordered structure from amorphous silicon layer, the wavelike hard nanomask 1 is formed almost immediately on the surface of AlGaAs layer, and in this case the thickness of this layer can be 200 nm less than that in the case of a self-forming nanomask in the AlGaAs layer. Thus, the formation of nanomask 1 in a layer of aluminum-containing semiconductor through the transfer of wave-ordered structure topography from the layer of amorphous silicon may be the most suitable for thin-film LEDs having thin layers of semiconductor compounds.

The etching selectivity of GaN, AlGaN, and AlGaInN with respect to aluminum nitride (AlN) and silicon nitride (SiN) for known etchants is moderate and reaches 5-6. Therefore, it can be difficult to form high-aspect ratio structures on the surface of materials that are based on gallium nitride using nanomasks with thin layers of AlN and SiN not exceeding 10-20 nm. A significant increase in selectivity to 15 and above for etching materials based on gallium nitride is possible through the use of nickel masks. RIE processes are known with etching selectivity for sapphire and silicon carbide with respect to nickel, which exceeds 7 and 50, respectively.

Figure 4C:
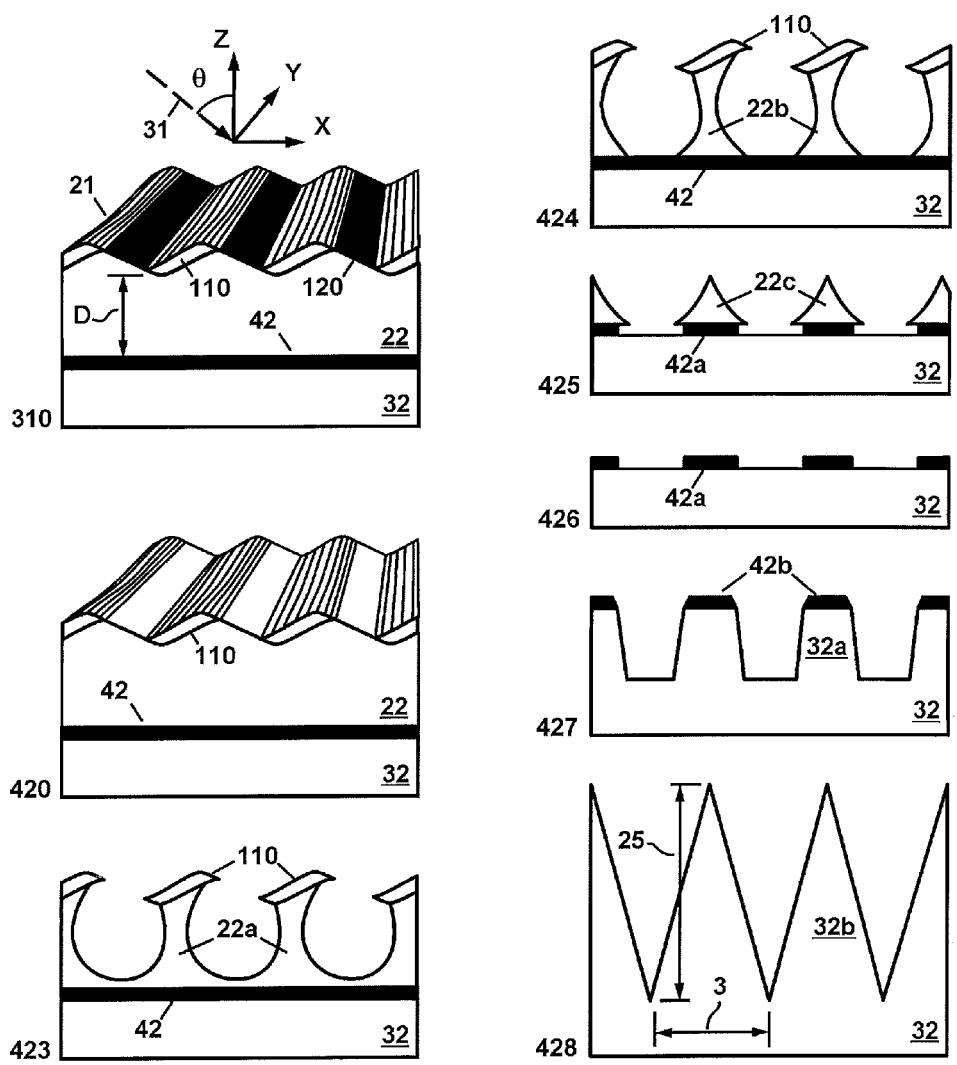

FIG. 4C illustrates steps of a method for nanostructuring the surface of a material 32 through the use of an intermediate metal nanomask, for example, Ni nanomask. The structure 310 differs from the structure 300 in FIGS. 4A to 4B in that, instead of material layer 2, material layer 32 and metal layer 42 are used. The process of forming a wavelike hard nanomask 21 in a layer of amorphous silicon 22 is the same as described above. The contrast of nanomask 21 can be enhanced in $HNO_3/HF$ wet etchant due to dissolution of regions 120 with the resulting formation of the structure 420. The etching of amorphous silicon between the regions 110 of silicon nitride in $Cl_2/O_2$ plasma results in the formation of the structures 423 and 424. In an RIE process, regions 110 with reduction in their thickness and width are transformed to the regions 110a and 110b. Simultaneously the regions 22a and 22b of amorphous silicon are formed. The etching of the metal layer, which can be performed by any known method including sputtering by argon ions or etching in a liquid selective etchant, results in the structure 425 with areas 42a of metal nanomask. If desired, the regions 110b of silicon nitride and the regions 22b of amorphous silicon can be removed using, for example, $SF_6$ plasma with the formation of the structure 426.

Then the RIE process is applied to material 32 using a plasma selective to Ni. For example, the etching of SiC can be implemented in $SF_6$ plasma wherein SiC to Ni etch selectivity is greater than 50 (see, for example, Chabert P. Deep etching of silicon carbide for micromachining applications: Etch rates and etch mechanisms, J. Vac. Sci. Technol. B, Vol. 19, Issue 4, 2001, pp. 1339-1345, incorporated herein by reference). In a $BCl_3/N_2/Ar$ plasma, GaN to Ni etch selectivity reaches 15 (see, for example, Liann-Be Chang, Su-Sir Liu and Ming-Jer Jeng, Etching Selectivity and Surface Profile of GaN in the Ni, $SiO_2$ and Photoresist Masks Using an Inductively Coupled Plasma, Jpn. J. Appl. Phys., Vol. 40, 2001, pp. 1242-1243, incorporated herein by reference). The etch selectivity of sapphire with respect to Ni exceeds 7 in an Oxford Instruments Plasmalab System 100 ICP-RIE tool. As a result of RIE, the structure 427 is formed with elements 42b of Ni-nanomask and elements 32a on the surface of material 32. Further etching leads to the removal of elements 42b of the metal mask and to the sharpening of the structure profile by the mechanism described above resulting in the formation of the structure 428. Depending on the selectivity and RIE modes, the ratio of height 25 of the elements 32b to the array period 3 may be in the range from, for example, 0.5 to 5.

Figure 4D:
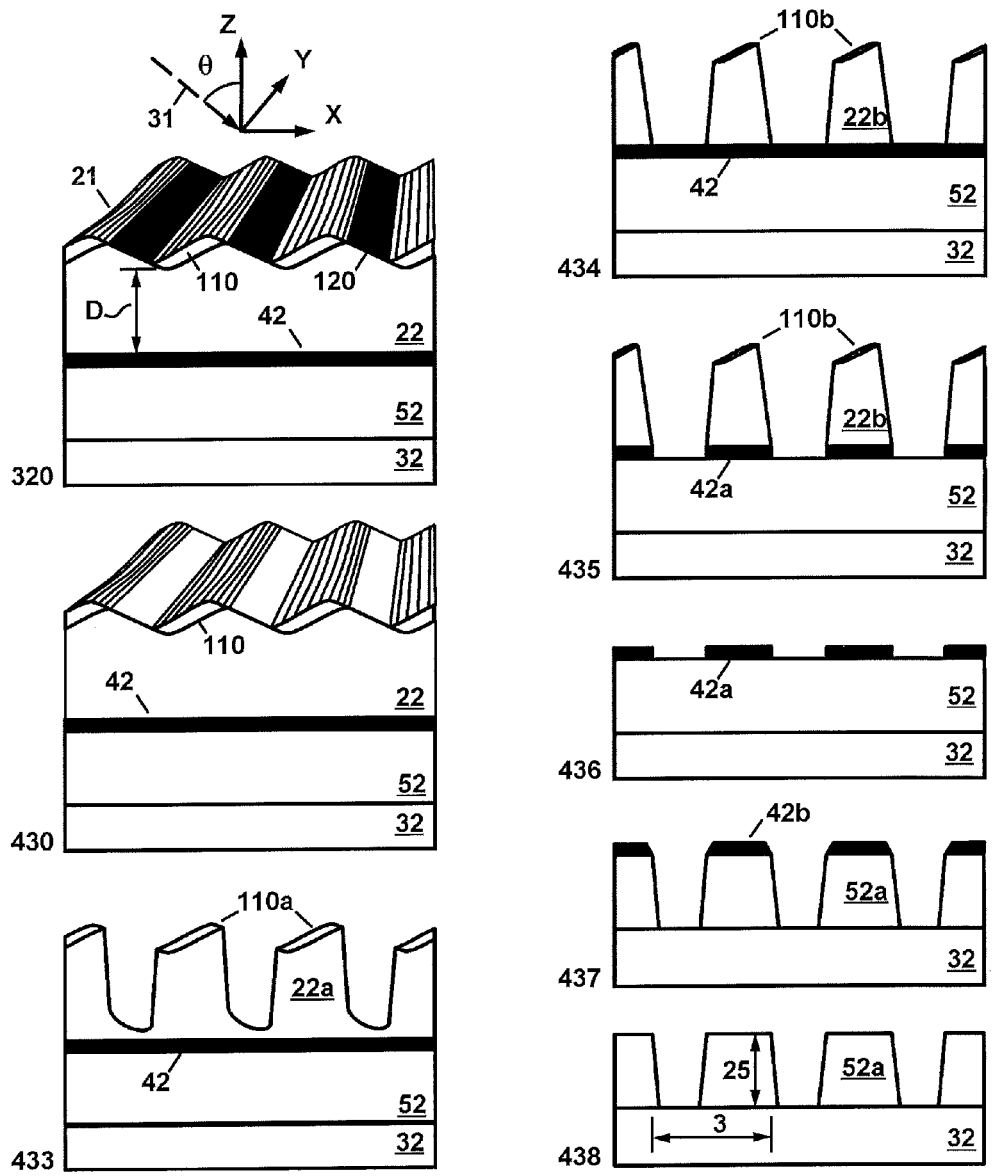

FIG. 4D shows steps of a method for nanostructuring a transparent inorganic layer through the use of an intermediate metal nanomask. In this case, the structure 320 differs from the structure 310 in that a layer of transparent oxide 52 is disposed between the layer 32 and the metal layer 42. After the removal of layers 120 in plasma, the structure 430 is formed. The etching of amorphous silicon between the regions 110 of silicon nitride in $Cl_2/O_2$ plasma results in the formation of the structures 433 and 434. In an RIE process, regions 110 with reduction in their thickness and width are transformed to the regions 110a and 110b. Simultaneously the regions 22a and 22b of amorphous silicon are formed. The etching of the metal layer, which can be performed by any known method including sputtering by argon ions or etching in a liquid selective etchant, results in the structure 435 with areas 42a of metal nanomask. If desired, the regions 110b of silicon nitride and the regions 22b of amorphous silicon can be removed using, for example, $SF_6$ plasma with the formation of the structure 436. The etching of a transparent oxide layer 52 through the metal nanomask is carried out by known methods, and the structure 437 is formed with elements 52a of the transparent oxide layer and elements 42b of metal nanomask. For example, a layer of silicon oxide can be etched selectively in $C_4F_8/Ar$ plasma. The metal nanomask is removed and the structure 438 is formed with elements 52a of transparent oxide on the surface of material 32 of a LED substrate. In this case, the ratio of the element height 25 to the array period 3 may be less than 1.0.

Figure 5A:
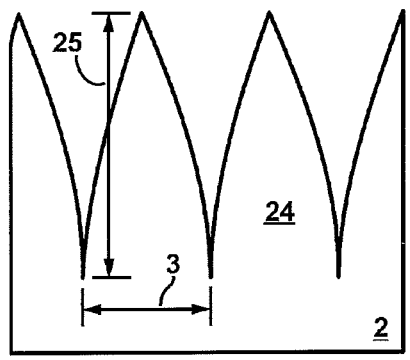
FIGS. 5A to 5F are cross-sectional views of different embodiments of nanostructured surfaces, according to the invention.
Figure 5D:
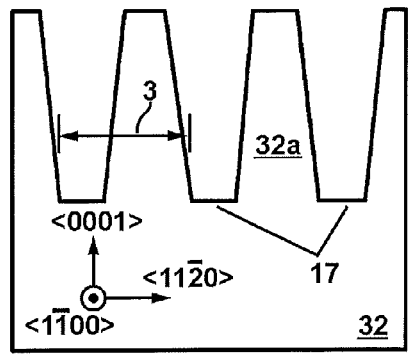
Figure 5B:
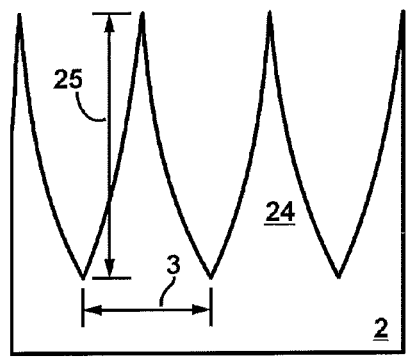
Figure 5E:
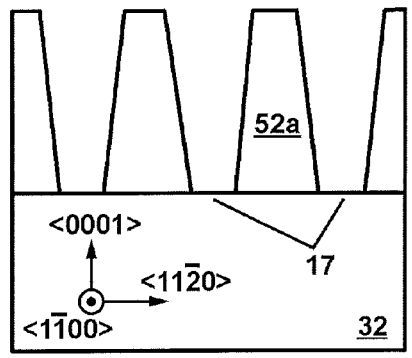
Figure 5C:
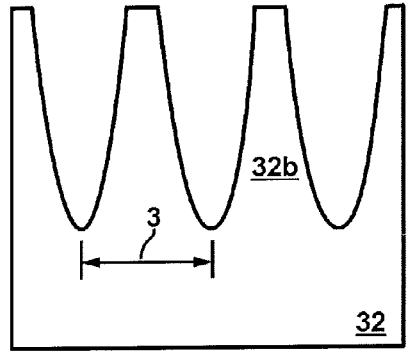
Figure 5F:
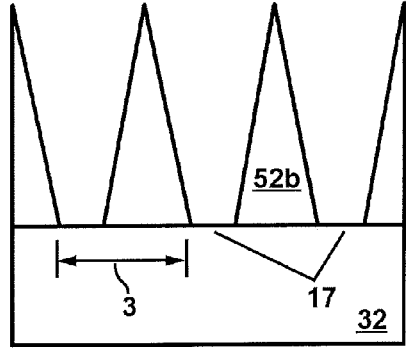

FIG. 5A shows possible wavelike cross-sectional shape of nanoridges 24b with convex walls, and FIG. 5B shows a profile of nanoridges 24c with concave walls. FIG. 5C shows a possible cross-sectional shape of elements 32b disposed on the light-emitting surface of a LED substrate of material 32. FIG. 5D shows elements 32a and FIG. 5E shows elements 52a of the transparent oxide material, which are oriented along the <1-100> direction on the surface of a monocrystalline substrate 32 for LEDs. FIG. 5F shows tooth-shaped elements 52b of a transparent oxide material on the surface of the substrate 32. Flat areas 17 on the surface of a monocrystalline substrate 32 are necessary for epitaxial growth of crystalline semiconductor layers of LEDs.

In the description above examples of structures and methods using specific materials have been illustrated. It will be understood that similar structures can be formed, and methods used, based on other materials. In particular, other semiconductor materials can be used in place of the semiconductor materials described above. For example, gallium-containing semiconductor materials may be used instead of aluminum-containing semiconductor materials.

The above specification, examples and data provide a description of the manufacture and use of the composition of the invention. Since many embodiments of the invention can be made without departing from the spirit and scope of the invention, the invention also resides in the claims hereinafter appended.

What is claimed as new and desired to be protected by Letters Patent of the United States is:

1. A light emitting diode, comprising:
a plurality of layers including at least three semiconductor layers configured and arranged to emit light upon application of electrical energy, wherein a first layer of the plurality of layers has a nanostructured surface, the nanostructured surface comprising a quasi-periodic, anisotropic array of elongated ridge elements having a wave-ordered structure pattern, each ridge element having a wavelike cross-section and oriented substantially in a first direction, wherein the first layer is one of the at least three semiconductor layers.

2. The light emitting diode of claim 1, wherein the first layer comprises an aluminum-containing semiconductor.

3. The light emitting diode of claim 2, wherein the aluminum containing semiconductor is selected from AlAs, AlGaAs, AlGaInP, AlGaN, and AlGaInN.

4. The light emitting diode of claim 1, wherein the first layer comprises a gallium-containing semiconductor.

5. The light emitting diode of claim 4, wherein the gallium containing semiconductor is selected from GaP, GaAs, GaN, AlGaAs, AlGaInP, AlGaN, and AlGaInN.

6. The light emitting diode of claim 1, wherein the plurality of layers comprises a substrate selected from sapphire ($Al_2O_3$), silicon (Si), silicon carbide (SiC), spinel ($MgAl_2O_4$), neodymium gallate ($NdGaO_3$), lithium gallate ($LiGaO_2$), zinc oxide (ZnO), magnesium oxide (MgO), gallium phosphide (GaP), gallium arsenide (GaAs), and gallium nitride (GaN).

7. A device, comprising
the light emitting diode of claim 1.

8. A method of making the light emitting diode of claim 1, the method comprising:
depositing a layer of amorphous silicon on a surface of an aluminum-containing semiconductor layer;
irradiating a surface of the amorphous silicon with an oblique beam of nitrogen ions to form a wave-ordered structure in the layer of amorphous silicon; and
further irradiating the surface of the amorphous silicon with an oblique beam of nitrogen ions to transfer the wave-ordered structure to a surface of the aluminum-containing semiconductor layer forming a nanomask, the nanomask comprising a quasi-periodic, anisotropic array of elongated elements having a wave-ordered structure pattern and a wave-like cross-section.

9. The method of claim 8, wherein the nanomask has the following structure in cross-section: an inner region of the aluminum-containing semiconductor layer, a first outer region containing aluminum nitride covering a first portion of the inner region, and a second outer region containing aluminum nitride covering a second portion of the inner region and connecting with the first outer region at a wave crest, wherein the first outer region is substantially thicker than the second outer region.

10. The method of claim 9, further comprising etching the nanomask to remove the second outer region.

11. The method of claim 10, further comprising, after removing the second outer region, etching the second portion of the aluminum-containing semiconductor layer that was below the second outer region.

12. The method of claim 8, further comprising, after forming the nanomask, removing the amorphous silicon.

13. A light emitting diode, comprising:
a plurality of layers including at least three semiconductor layers configured and arranged to emit light upon application of electrical energy, wherein a first layer of the plurality of layers has a nanostructured surface, the nanostructured surface comprising a quasi-periodic, anisotropic array of elongated ridge elements having a wave-ordered structure pattern, each ridge element having a wavelike cross-section and oriented substantially in a first direction, wherein the nanostructured surface is a light emitting surface.

14. The light emitting diode of claim 13, wherein the nanostructured surface is disposed on a back external side of the plurality of layers.

15. The light emitting diode of claim 13, wherein the nanostructured surface is an internal surface disposed adjacent to a second layer of the plurality of layers.

16. A light emitting diode, comprising:
a plurality of layers including at least two layers, wherein a first layer of the plurality of layers has a nanostructured surface, the nanostructured surface comprising a quasi-periodic, anisotropic array of elongated ridge elements having a wave-ordered structure pattern, each ridge element having a wavelike cross-section and oriented substantially in a first direction, wherein the first layer comprises a transparent inorganic material disposed between at least two semiconductor layers.

* * * * *